(12) United States Patent
Jung et al.

(10) Patent No.: US 10,671,225 B2
(45) Date of Patent: Jun. 2, 2020

(54) TOUCH SENSOR AND DISPLAY DEVICE INCLUDING THE SAME

(71) Applicant: Samsung Display Co., Ltd., Yongin-si, Gyeonggi-do (KR)

(72) Inventors: Han Yung Jung, Yongin-si (KR); Chaun Gi Choi, Yongin-si (KR); Ji Hun Ryu, Yongin-si (KR); Jung Ha Son, Yongin-si (KR); Tae Kyung Ahn, Yongin-si (KR)

(73) Assignee: Samsung Display Co., Ltd. (KR)

( * ) Notice: Subject to any disclaimer, the term of this patent is extended or adjusted under 35 U.S.C. 154(b) by 139 days.

(21) Appl. No.: 15/866,147

(22) Filed: Jan. 9, 2018

(65) Prior Publication Data

US 2018/0335868 A1 Nov. 22, 2018

(30) Foreign Application Priority Data

May 16, 2017 (KR) .......................... 10-2017-0060693

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0416* (2013.01); *H01L 41/1132* (2013.01); *G06F 3/0412* (2013.01); *G06F 2203/04105* (2013.01); *G06F 2203/04111* (2013.01); *G06F 2203/04112* (2013.01); *H01L 27/323* (2013.01);
(Continued)

(58) Field of Classification Search
CPC ...... G06F 3/044; G06F 3/0416; G06F 3/0412; G06F 2203/04112; G06F 2203/04111; G06F 2203/04105; G06F 2203/04103; G06F 2203/04102; H01L 27/323; H01L 51/5237; H01L 41/18; H01L 41/1132; H01L 41/193
See application file for complete search history.

(56) References Cited

U.S. PATENT DOCUMENTS 4,634,917 A * 1/1987 Dvorsky ................ G01B 7/004
310/323.21
7,701,445 B2 4/2010 Inokawa et al.
(Continued)

OTHER PUBLICATIONS

Rendl et al., "PyzoFlex: Printed Piezoelectric Pressure Sensing Foil," Proceeding UIST '12 Proceedings of the 25th annual ACM symposium on User interface software and technology, pp. 509-518, Oct. 7, 2012.

(Continued)

*Primary Examiner* — Abhishek Sarma
(74) *Attorney, Agent, or Firm* — Innovation Counsel LLP

(57) ABSTRACT

A touch sensor includes: a first insulating layer disposed on a substrate; a plurality of first touch sensing cells disposed on the first insulating layer and coupled to each other in a first direction by first coupling patterns; a plurality of second touch sensing cells disposed on the first insulating layer and coupled to each other in a second direction by second coupling patterns; and a second insulating layer disposed on the first touch sensing cells and the second touch sensing cells. At least one of the first insulating layer or the second insulating layer includes a piezoelectric material.

18 Claims, 9 Drawing Sheets

(51) Int. Cl.
   *H01L 41/113* (2006.01)
   *H01L 41/18* (2006.01)
   *H01L 51/52* (2006.01)
   *H01L 27/32* (2006.01)
   *H01L 41/193* (2006.01)

(52) U.S. Cl.
   CPC ............ *H01L 41/18* (2013.01); *H01L 41/193* (2013.01); *H01L 51/5237* (2013.01)

(56) References Cited

U.S. PATENT DOCUMENTS

| | | | |
|---|---|---|---|
| 9,612,690 B2 | 4/2017 | Zirkl et al. | |
| 2009/0309843 A1* | 12/2009 | Kim | G06F 3/0414 |
| | | | 345/173 |
| 2013/0265256 A1* | 10/2013 | Nathan | G06F 3/0414 |
| | | | 345/173 |
| 2014/0362020 A1 | 12/2014 | Rothkopf et al. | |
| 2015/0070305 A1* | 3/2015 | Seo | G06F 3/0412 |
| | | | 345/174 |
| 2015/0123931 A1* | 5/2015 | Kitchens | G06F 3/0414 |
| | | | 345/174 |
| 2015/0331517 A1* | 11/2015 | Filiz | G06F 3/0414 |
| | | | 345/173 |
| 2015/0378493 A1* | 12/2015 | Kano | G06F 3/044 |
| | | | 345/173 |
| 2016/0313793 A1 | 10/2016 | Hong et al. | |
| 2016/0334924 A1 | 11/2016 | Heubel | |
| 2016/0357289 A1 | 12/2016 | Jeong | |
| 2017/0371470 A1* | 12/2017 | Nathan | G06F 3/0414 |
| 2018/0143728 A1* | 5/2018 | Withers | G06F 3/0412 |

OTHER PUBLICATIONS

Jung et al., "A Polysilicon Field Effect Transistor Pressure Sensor of Thin Nitride Membrane Choking Effect of Right After Turn-on for Stress Sensitivity Improvement," Journal of Sensor Science and Technology, vol. 23, No. 2 (2014) pp. 114-121.

Sharma et al., "Patterning Piezoelectric Thin Film PVDF—TrFE Based Pressure Sensor for Catheter Application," Sensors and Actuators A: Physical, vol. 177, pp. 87-92, Apr. 2012.

Scheipl et al., "A Fully Printed Piezoelectric Energy Converter for Sensor Applications," PyzoFlex Poster PE2013, Joanneum Research Forschungsgesellschaft mbH, 1 page.

* cited by examiner

TOUCH SENSOR AND DISPLAY DEVICE INCLUDING THE SAME

CROSS-REFERENCE TO RELATED APPLICATION

The present application claims priority to Korean patent application number 10-2017-0060693 filed on May 16, 2017, the entire disclosure of which is incorporated herein in its entirety by reference.

BACKGROUND

Field of Invention

Various embodiments of the present disclosure relate to a touch sensor and a display device including the touch sensor.

Description of Related Art

With an increasing interest in an information display and demand for using portable information media, research on display devices and commercialization thereof have rapidly progressed.

In addition to an image display function, a recent display device includes a touch sensor configured to receive a touch from a user allowing the user to use the display device more conveniently and interactively.

The touch sensor may provide not only a location of a touch but also a pressure generated by the touch. The location and pressure information obtained by the touch sensor can provide various functions to the user.

SUMMARY

Various embodiments of the present disclosure are directed to a touch sensor capable of complexly determining a location and a magnitude of a touch, and a display device including the touch sensor.

Various embodiments of the present disclosure are directed to a touch sensor having a thin structure and flexible characteristics, and a display device including the touch sensor.

Various embodiments of the present disclosure are directed to reducing a manufacturing cost of the touch sensor and the display device including the touch sensor.

An embodiment of the present disclosure may provide a touch sensor including: a first insulating layer disposed on a substrate; a plurality of first touch sensing cells disposed on the first insulating layer and coupled to each other in a first direction by first coupling patterns; a plurality of second touch sensing cells disposed on the first insulating layer and coupled to each other in a second direction by second coupling patterns; and a second insulating layer disposed on the first touch sensing cells and the second touch sensing cells. At least one of the first insulating layer or the second insulating layer may include a piezoelectric material.

In an embodiment, the piezoelectric material may include at least one of ZnO, BaTiO3, PZT, PVDF, P(VDF-TrFE), P(VDF-TrFE-CTFE), P(VDF-TrFE-CFE), or P(VDF-HFP).

In an embodiment, the second coupling patterns may be disposed under the first insulating layer and coupled to the second touch sensing cells through contact holes formed in the first insulating layer.

In an embodiment, the second insulating layer may include the piezoelectric material. When a touch having a predetermined magnitude or larger is applied to the touch sensor, a piezoelectric signal may be generated by the second insulating layer corresponding to the touch.

In an embodiment, the first insulating layer may include the piezoelectric material. When a touch having a predetermined magnitude or larger is applied to the touch sensor, a piezoelectric signal may be generated by the first insulating layer corresponding to the touch.

In an embodiment, when a touch is inputted to the touch sensor, capacitance between the first touch sensing cells and the second touch sensing cells that corresponds to the touch may be changed.

In an embodiment, the touch sensor may further include: a touch controller configured to sense a location and a magnitude of a touch inputted to the touch sensor using output signals of the first touch sensing cells. Each of the output signals may include at least one of a voltage variation corresponding to a variation in the capacitance or a voltage variation corresponding to a piezoelectric signal generated by the piezoelectric material.

In an embodiment, the first touch sensing cells and the second touch sensing cells may have a mesh structure.

An embodiment of the present disclosure may provide a touch sensor including: a plurality of first touch electrodes including first coupling patterns, and first touch sensing cells coupled to each other in a first direction by the first coupling patterns; a plurality of second touch electrodes including second coupling patterns, and second touch sensing cells coupled to each other in a second direction by the second coupling patterns; and a piezoelectric layer disposed on the first touch sensing cells and the second touch sensing cells. The second coupling patterns may be disposed on the piezoelectric layer and coupled to the second touch sensing cells through contact holes formed in the piezoelectric layer.

In an embodiment, the touch sensor may further include an insulating layer disposed on the second coupling patterns and the piezoelectric layer.

In an embodiment, the piezoelectric layer may include at least one of ZnO, BaTiO3, PZT, PVDF, P(VDF-TrFE), P(VDF-TrFE-CTFE), P(VDF-TrFE-CFE), or P(VDF-HFP).

In an embodiment, when a touch having a predetermined magnitude or larger is applied to the touch sensor, a piezoelectric signal may be generated by the piezoelectric layer corresponding to the touch.

In an embodiment, the touch sensor may further include a touch controller configured to sense a location and a magnitude of a touch inputted to the touch sensor using output signals of the first touch sensing cells. Each of the output signals may include at least one of a voltage variation corresponding to a variation in capacitance between the first touch electrodes or the second touch electrodes and a voltage variation corresponding to the piezoelectric signal.

An embodiment of the present disclosure may provide a touch sensor including: first touch electrodes, and second touch electrodes configured to form capacitance with the first touch electrodes; an insulating layer disposed on the first touch electrodes and the second touch electrodes; third touch electrodes and fourth touch electrodes disposed on the insulating layer; and a piezoelectric layer disposed on the third touch electrodes and the fourth touch electrodes. The piezoelectric layer may generate a piezoelectric signal corresponding to an external force.

In an embodiment, the piezoelectric layer may include at least one of ZnO, BaTiO3, PZT, PVDF, P(VDF-TrFE), P(VDF-TrFE-CTFE), P(VDF-TrFE-CFE), or P(VDF-HFP).

In an embodiment, the touch sensor may further include: a touch controller configured to calculate a location or a magnitude of a touch with reference to at least one of a variation in capacitance included in an output signal of the first touch sensing electrodes or a piezoelectric signal included in an output signal of the third touch sensing electrodes.

An embodiment of the present disclosure may provide a display device including: a plurality of light-emitting elements; an encapsulation layer disposed on the light-emitting elements; a first insulating layer disposed on the encapsulation layer; a plurality of first touch sensing cells disposed on the first insulating layer and coupled to each other in a first direction by first coupling patterns; a plurality of second touch sensing cells disposed on the first insulating layer and coupled to each other in a second direction by second coupling patterns; and a second insulating layer disposed on the first touch sensing cells and the second touch sensing cells. At least one of the first insulating layer or the second insulating layer may include a piezoelectric material.

In an embodiment, when a touch having a predetermined magnitude or larger is applied to the display device, a piezoelectric signal may be generated by the piezoelectric material corresponding to the touch.

DETAILED DESCRIPTION

Figure 1:
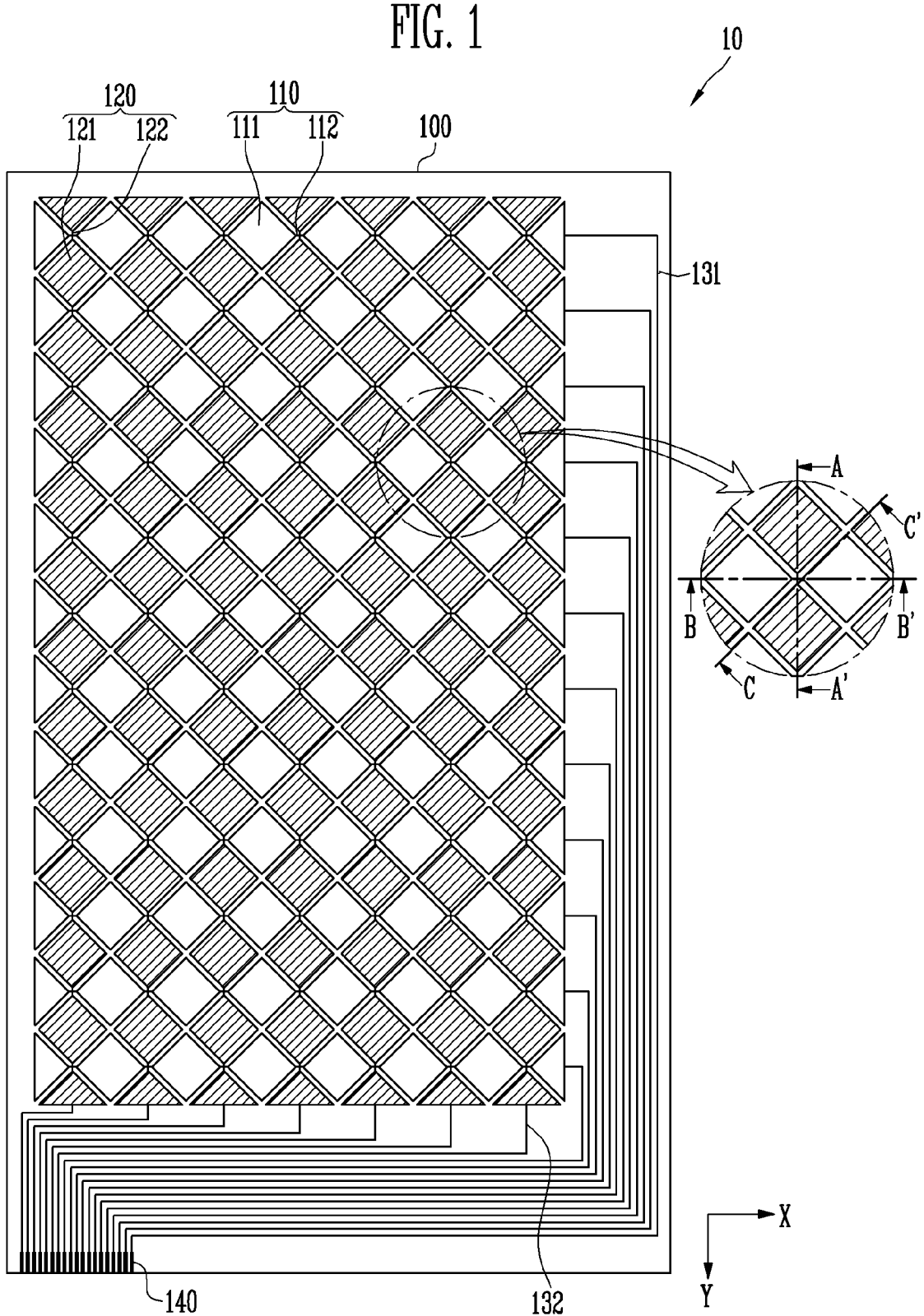
FIG. 1 is a diagram illustrating the configuration of a touch sensor in accordance with an embodiment of the present disclosure.

Details of various embodiments of the present disclosure are described in the detailed description and the accompanying drawings.

In addition, advantages and various features of the present disclosure, and methods for achieving the same will be clearly understood with reference to the embodiments described herein together with the accompanying drawings. However, it is to be noted that the present disclosure is not limited to the embodiments described herein but can be embodied in various other ways. In the present disclosure, "connected/coupled" refers to one component not only directly coupling with another component but also indirectly coupling with another component through one or more intermediate components. Furthermore, in the drawings, portions unrelated to the present disclosure may be omitted to clarify the description of the present disclosure, and the same reference numerals are used throughout the different drawings to designate the same or similar components.

In the present disclosure, for the sake of description, the direction in which an image is displayed refers to 'upward' or 'forward', and the opposite direction refers to 'downward' or 'rearward'.

Hereinafter, a touch sensor and a display device including the touch sensor in accordance with various embodiments of the present disclosure will be described with reference to the accompanying drawings.

FIG. 1 is a diagram illustrating the configuration of a touch sensor 10 in accordance with an embodiment of the present disclosure.

Referring to FIG. 1, the touch sensor 10 may include first touch electrodes 110 and second touch electrodes 120.

The first touch electrodes 110 and the second touch electrodes 120 may be disposed on a substrate 100.

The substrate 100 may be made of an insulating material such as glass or resin. Furthermore, the substrate 100 may be made of a material having flexibility to be bendable or foldable. The substrate 100 may have a single layer or multilayer structure.

For example, the substrate 100 may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, the material that the substrate 100 is made of may be changed in various ways. For example, the substrate 100 may also be made of fiber-reinforced plastic (FRP) or the like.

The first touch electrodes 110 may extend in a first direction (e.g., an X-axis direction) and be arranged in a second direction (e.g., a Y-axis direction) intersecting the first direction.

The second touch electrodes 120 may extend in the second direction (e.g., the Y-axis direction) and be arranged in the first direction (e.g., the X-axis direction).

The first touch electrodes 110 and the second touch electrodes 120 may be disposed to intersect each other. The first touch electrodes 110 and the second touch electrodes 120 may collectively form a capacitive touch sensor.

For example, capacitance is formed between the first touch electrodes 110 and the second touch electrodes 120. When a touch is inputted to the touch sensor 10, capacitance at or near a location at which the touch is inputted may be changed. The location of the touch may be detected by sensing a change in capacitance of the touch sensor 10.

Each of the first touch electrodes 110 may include a first touch sensing cell 111. A plurality of first touch sensing cells 111 may be arranged in the first direction (e.g., the X-axis direction) at predetermined intervals, and a plurality of first coupling patterns 112 may be configured to electrically couple adjacent first touch sensing cells 111 with one another.

Each of the second touch electrodes 120 may include a second touch sensing cell 121. A plurality of second touch sensing cells 121 may be arranged in the second direction (e.g., the Y-axis direction) at predetermined intervals, and a plurality of second coupling patterns 122 may be configured to electrically couple adjacent second touch sensing cells 121 with one another.

Here, the first touch sensing cells 111 may be distributed and disposed between adjacent second touch sensing cells 121, and the second touch sensing cells 121 may be distributed and disposed between adjacent first touch sensing cells 111. The first and second touch sensing cells 111 and 121 may not overlap with one another.

Referring to FIG. 1, each of the first and second touch sensing cells 111 and 121 has a polygonal shape. However, the shapes of the first and second touch sensing cells 111 and 121 may be changed in various ways.

The touch sensor 10 may further include a plurality of pads 140, a plurality of first lines 131, and a plurality of second lines 132. The first lines 131 may be coupled between the first touch electrodes 110 and the pads 140. The second lines 132 may be coupled between the second touch electrodes 120 and the pads 140.

The first and second lines 131 and 132 may be coupled to an external touch controller (not shown) by the pads 140.

For example, the touch controller may supply driving signals to the first touch electrodes 110 and detect a location of a touch using sensing signals outputted from the second touch electrodes 120.

Alternatively, the touch controller may supply driving signals to the second touch electrodes 120 and detect a location of a touch using sensing signals outputted from the first touch electrodes 110.

Although FIG. 1 shows that the first lines 131 form a single routing structure in which the first lines 131 are coupled to only one end of a row of the first touch electrodes 110, and the second lines 132 form a single routing structure in which the second lines 132 are coupled to only one end of a row of the second touch electrodes 120, the present disclosure is not limited thereto.

For example, at least one of the first and second lines 131 and 132 may have a double routing structure. The touch sensor 10 having a double routing structure may have an improved touch sensitivity.

In other words, the first lines 131 may have a double routing structure in which the first lines 131 are coupled to the respective opposite ends of a row of the first touch electrodes 110. The second lines 132 may also have a double routing structure in which the second lines 132 are coupled to the respective opposite ends of a row of the second touch electrodes 120.

The first touch electrodes 110 and the second touch electrodes 120 may include a conductive material. For example, the first and second touch electrodes 110 and 120 may include a metal, or an alloy of metals. Examples of the metal include, but are not limited to, gold (Au), silver (Ag), aluminum (Al), molybdenum (Mo), chrome (Cr), titanium (Ti), nickel (Ni), neodymium (Nd), copper (Cu), and platinum (Pt).

The first touch electrodes 110 and the second touch electrodes 120 may be formed of a transparent conductive material. Examples of the transparent conductive material include, but are not limited to, a silver nanowire (AgNW), indium tin oxide (ITO), indium zinc oxide (IZO), antimony zinc oxide (AZO), indium tin zinc oxide (ITZO), zinc oxide (ZnO), tin oxide (SnO2), a carbon nanotube, and grapheme. Each of the first and second touch electrodes 110 and 120 may have a single layer or multilayer structure.

The first touch electrodes 110 and the second touch electrodes 120 may be formed of the same material or different materials.

Figure 2:
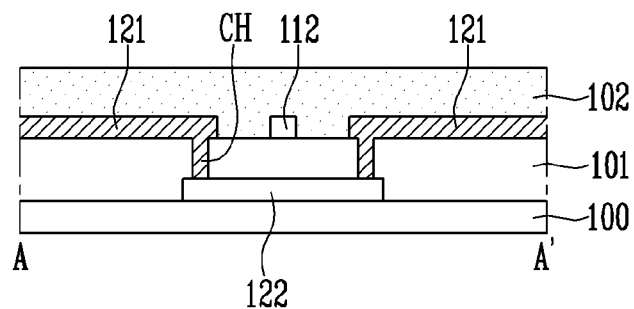
FIG. 2 is a cross-sectional view taken along line A-A' of FIG. 1.
Figure 3:
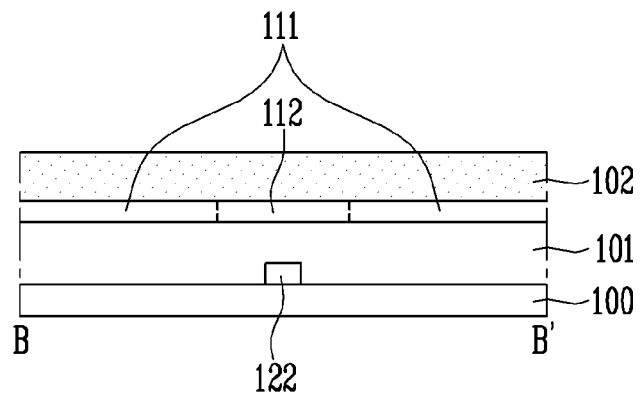
FIG. 3 is a cross-sectional view taken along line B-B' of FIG. 1.

FIG. 2 is a cross-sectional view taken along line A-A' of FIG. 1, FIG. 3 is a cross-sectional view taken along line B-B' of FIG. 1, and FIGS. 4 to 6 are cross-sectional views taken along line C-C' of FIG. 1.

Figure 4:
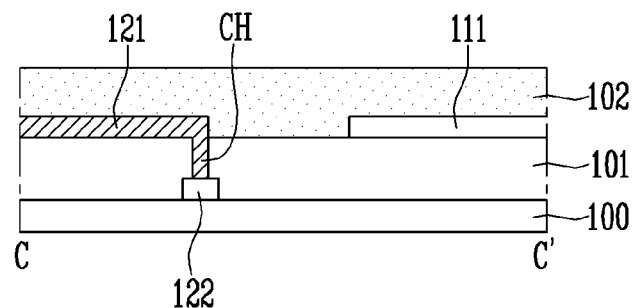
FIGS. 4 to 6 are cross-sectional views taken along line C-C' of FIG. 1.

Referring to FIGS. 2 and 4, the first touch sensing cells 111 and the second touch sensing cells 121 may be disposed on a first insulating layer 101.

The first coupling patterns 112 may be disposed on the first insulating layer 101, and the second coupling patterns 122 may be disposed on the substrate 100 and under the first insulating layer 101. The first insulating layer 101 may provide electric insulation between the first coupling patterns 112 and the second coupling patterns 122.

The first coupling patterns 112 may couple adjacent first touch sensing cells 111. The second coupling patterns 122 may couple adjacent second touch sensing cells 121 through contact holes CH formed in the first insulating layer 101.

The first insulating layer 101 may include a single layer or multilayer structure. The first insulating layer 101 may include an inorganic material such as silicon oxide, silicon nitride, and silicon oxynitride.

The first insulating layer 101 may be an organic insulating layer formed of an organic material. Examples of the organic insulating material include, but are not limited to, a polyacryl-based compound, a polyimide-based compound, a fluorocarbon compound such as Teflon, and a benzocyclobutene compound.

A second insulating layer 102 may be disposed on the first insulating layer 101 to cover the first touch sensing cells 111, the first coupling patterns 112, and the second touch sensing cells 121.

The second insulating layer 102 may be an inorganic insulating layer formed of an inorganic material, or an organic insulating layer formed of an organic material. In particular, the second insulating layer 102 may be formed of an inorganic or organic piezoelectric material having piezoelectric characteristics.

Examples of the inorganic piezoelectric material include, but are not limited to, ZnO, BaTiO3, and PZT. Examples of organic piezoelectric material include, but are not limited to, PVDF, P(VDF-TrFE), P(VDF-TrFE-CTFE), P(VDF-TrFE-CFE), and P(VDF-HFP).

The second insulating layer 102 may include at least one of the above-mentioned piezoelectric materials.

The second insulating layer 102 formed of a piezoelectric material may generate a piezoelectric signal corresponding to an external pressure applied to the touch sensor 10.

For example, when an external pressure is applied to the second insulating layer 102, dipoles between the first touch sensing cells 111 and the second touch sensing cells 121 that are adjacent to each other may be rearranged, or the direction of dipole moments may be changed, whereby a piezoelectric signal may be generated. Thus, the first touch sensing cells 111 may output a signal corresponding to the generated piezoelectric signal.

FIGS. 2 to 4 illustrate different embodiments in which the second insulating layer 102 is formed of a piezoelectric material. However, it is noted that the present disclosure is not limited to the examples of FIGS. 2 to 4.

Figure 5:
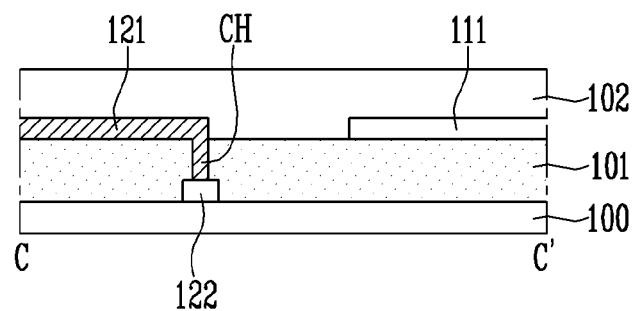

Referring to FIG. 5, the first insulating layer 101 may be formed of a piezoelectric material having piezoelectric characteristics. The first insulating layer 101 may include at least one of ZnO, BaTiO3, PZT, PVDF, P(VDF-TrFE), P(VDF-TrFE-CTFE), P(VDF-TrFE-CFE), and P(VDF-HFP).

The second insulating layer 102 may be an organic insulating layer formed of an organic material. Examples of the organic material include, but are not limited to, a polyacryl-based compound, a polyimide-based compound, a fluorocarbon compound such as Teflon, or a benzocyclobutene compound.

Figure 6:
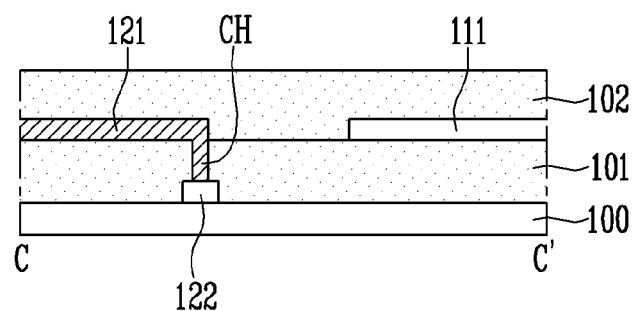

Referring to FIG. 6, both the first insulating layer 101 and the second insulating layer 102 may be formed of a piezoelectric material having piezoelectric characteristics.

In other words, each of the first insulating layer 101 and the second insulating layer 102 may include at least one of ZnO, BaTiO3, PZT, PVDF, P(VDF-TrFE), P(VDF-TrFE-CTFE), P(VDF-TrFE-CFE), and P(VDF-HFP).

The first insulating layer 101 and the second insulating layer 102 may be formed of the same piezoelectric material, or different piezoelectric materials.

Figure 7:
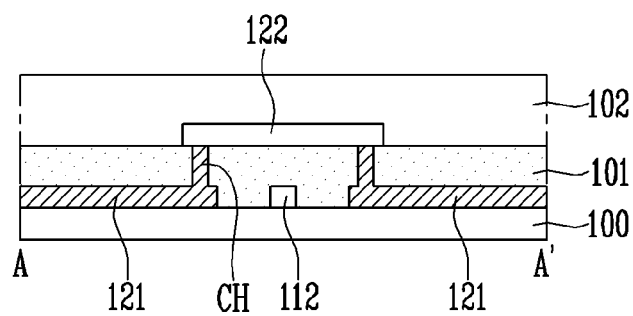
FIGS. 7 and 8 are diagrams illustrating the structure of a touch sensor in accordance with an embodiment of the present disclosure.
Figure 8:
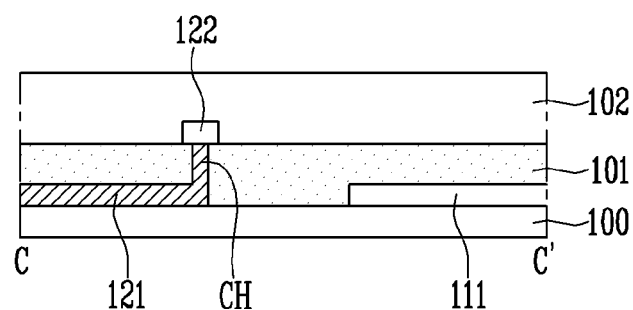

FIGS. 7 and 8 are diagrams illustrating the structure of a touch sensor in accordance with an embodiment of the present disclosure. In the following description, detailed description of the same parts as those of FIGS. 1 to 6 may be omitted, and differences from the embodiment of FIGS. 1 to 6 will be emphasized.

The touch sensor in accordance with the embodiment illustrated in FIGS. 7 and 8 may look identical to that of FIG. 1 in a plan view.

However, unlike the embodiment of FIG. 1, second coupling patterns 122 may be disposed on first touch sensing cells 111, first coupling patterns 112, and second touch sensing cells 121.

Referring to FIGS. 7 and 8, the first touch sensing cells 111, the second touch sensing cells 121, and the first coupling patterns 112 may be disposed on the substrate 100. A first insulating layer 101 may be disposed on the first touch sensing cells 111, the second touch sensing cells 121, and the first coupling patterns 112.

The second coupling patterns 122 may be disposed on the first insulating layer 101. The first insulating layer 101 may provide electric insulation between the first coupling patterns 112 and the second coupling patterns 122.

The first coupling patterns 112 may couple adjacent first touch sensing cells 111. The second coupling patterns 122 may couple adjacent second touch sensing cells 121 through contact holes CH formed in the first insulating layer 101. The first insulating layer 101 may be an inorganic insulating layer formed of an inorganic material, or an organic insulating layer formed of an organic material. The first insulating layer 101 may be formed of a piezoelectric material having piezoelectric characteristics.

Examples of the inorganic piezoelectric material include, but are not limited to, ZnO, BaTiO3, and PZT. Examples of the organic piezoelectric material include, but are not limited to, PVDF, P(VDF-TrFE), P(VDF-TrFE-CTFE), P(VDF-TrFE-CFE), and P(VDF-HFP).

The first insulating layer 101 may include at least one of the above-mentioned piezoelectric materials.

A second insulating layer 102 may be disposed on the first insulating layer 101 to cover the second coupling patterns 122 and the first insulating layer 101.

The second insulating layer 102 may be an organic insulating layer formed of an organic material. Examples of the organic insulating material include, but are not limited to, a polyacryl-based compound, a polyimide-based compound, a fluorocarbon compound such as Teflon, and a benzocyclobutene compound.

Alternatively, the second insulating layer 102 may be formed of a piezoelectric material in the same manner as that of the first insulating layer 101.

In the present embodiment, the first insulating layer 101 or the second insulating layer 102 including the above-mentioned piezoelectric material may correspond to a piezoelectric layer.

Figure 9:
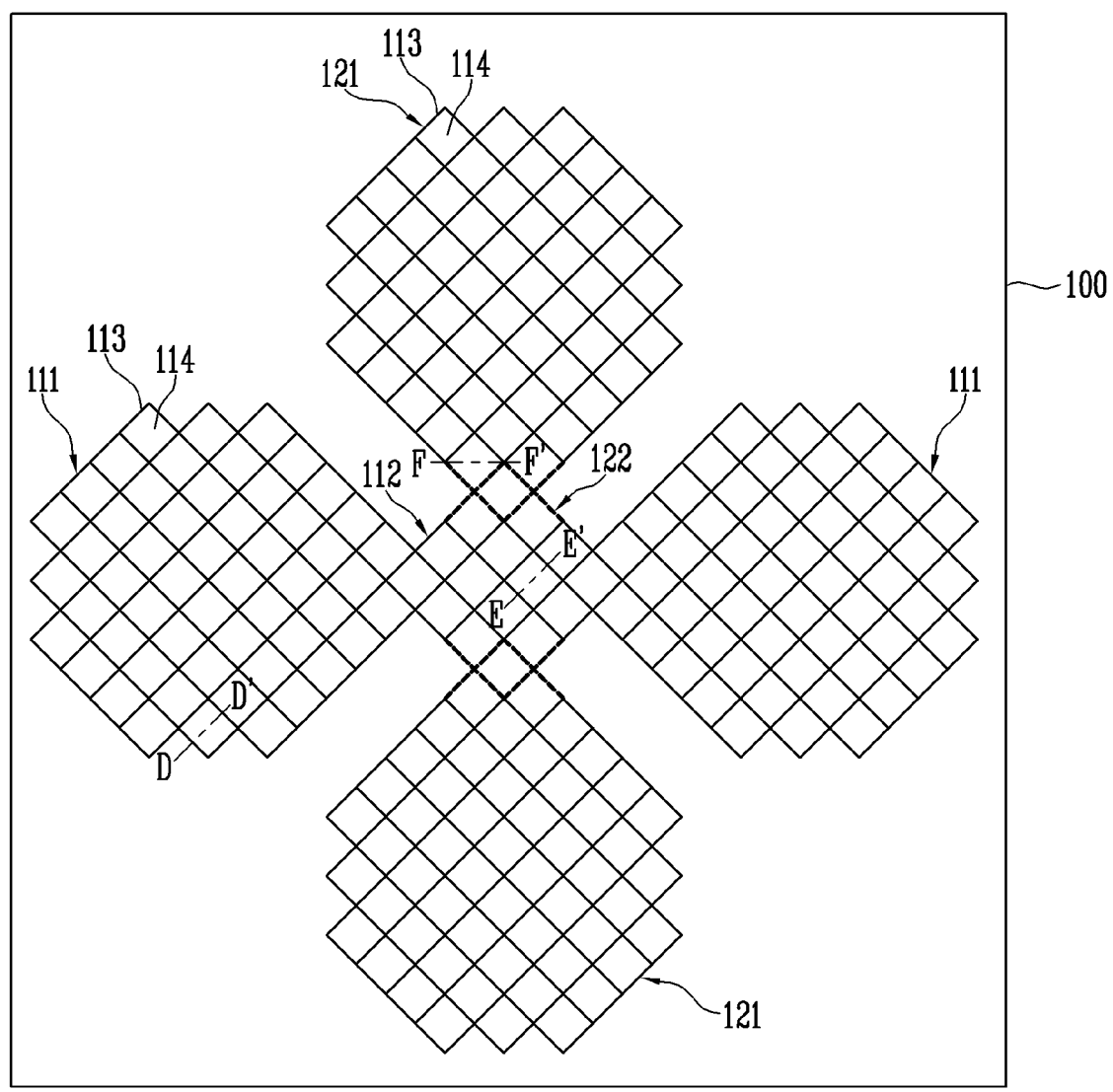
FIG. 9 is a diagram illustrating touch electrodes in accordance with an embodiment of the present disclosure.

FIG. 9 is a diagram illustrating touch electrodes in accordance with an embodiment of the present disclosure.

Particularly, FIG. 9 illustrates a pair of first touch sensing cells 111, a first coupling pattern 112 configured to couple the pair of first touch sensing cells 111 with each other, a pair of second touch sensing cells 121, and a second coupling pattern 122 configured to couple the pair of second touch sensing cells 121 with each other.

Referring to FIG. 9, the first touch sensing cells 111 may have a mesh structure including openings 114.

For example, the first touch sensing cells 111 may include conductive lines 113 that define the openings 114.

The first coupling pattern 112 may be disposed between the adjacent first touch sensing cells 111. The first coupling pattern 112 may have a mesh structure including openings 114 in the same manner as that of the first touch sensing cells 111.

For example, the first coupling pattern 112 may include conductive lines 113 that define the openings 114.

The second coupling pattern 122 disposed between the adjacent second touch sensing cells 121 may also have a mesh structure including openings 114.

For example, each of the second touch sensing cells 121 and the second coupling pattern 122 may include conductive lines 113 that define the openings 114.

The shapes and structures of the first and second touch sensing cells 111 and 121 and the first and second coupling patterns 112 and 122 may be changed in various ways.

Figure 10A:
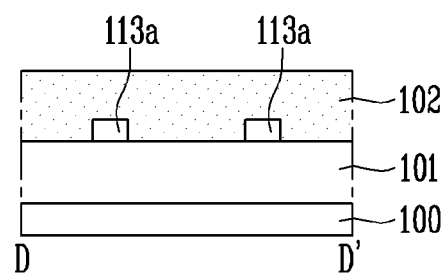
FIGS. 10A to 10C are cross-sectional views of FIG. 9.
Figure 10B:
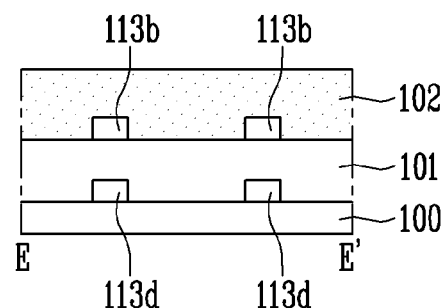
Figure 10C:
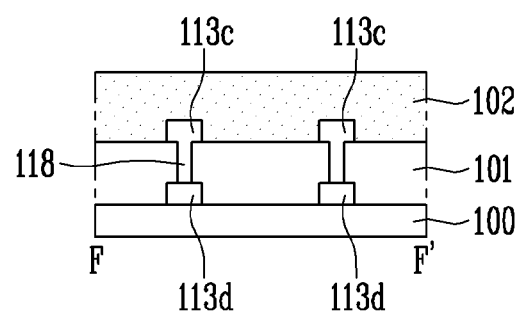

FIGS. 10A to 10C are cross-sectional views of FIG. 9. FIG. 10A is a cross-sectional view taken along line D-D' of FIG. 9, FIG. 10B is a cross-sectional view taken along line E-E' of FIG. 9, and FIG. 10C is a cross-sectional view taken along line F-F' of FIG. 9.

In FIGS. 10A to 10C, the conductive line of the first touch sensing cell 111 is denoted by "113$a$", the conductive line of the first coupling pattern 112 is denoted by "113$b$", the conductive line of the second touch sensing cell 121 is denoted by "113$c$", and the conductive line of the second coupling pattern 122 is denoted by "113$d$".

Referring to FIG. 10A, the first touch sensing cells 111 may be disposed on the first insulating layer 101.

The conductive lines 113$a$ of the first touch sensing cells 111 may be disposed on the first insulating layer 101.

Referring to FIG. 10B, the first insulating layer 101 may be disposed between the first coupling patterns 112 and the second coupling patterns 122. The first insulating layer 101 may provide electric insulation between the first coupling patterns 112 and the second coupling patterns 122.

For example, the first coupling patterns 112 may be disposed on the first insulating layer 101, and the second coupling patterns 122 may be disposed under the first insulating layer 101.

The conductive lines 113$b$ of the first coupling patterns 112 may be disposed on the first insulating layer 101, and the conductive lines 113$d$ of second coupling patterns 122 may be disposed under the first insulating layer 101.

Referring to FIG. 10C, the second touch sensing cells 121 may be disposed on the first insulating layer 101 in the same manner as that of the first touch sensing cells 111.

The conductive lines 113$c$ of the second touch sensing cells 121 may be disposed on the first insulating layer 101.

The first insulating layer 101 may be disposed between the second touch sensing cells 121 and the second coupling patterns 122. The second touch sensing cells 121 and the second coupling patterns 122 may be coupled with each other by contact holes 118 formed in the first insulating layer 101.

The conductive lines 113$d$ of the second coupling patterns 122 may be electrically coupled to the conductive lines 113$c$ of the second touch sensing cells 121 through the contact holes 118 formed in the first insulating layer 101.

In the embodiment shown in FIGS. 10A to 10C, the second insulating layer 102 may be formed of a piezoelectric material. In other embodiments, the first insulating layer 101 may be formed of a piezoelectric material, or both the first insulating layer 101 and the second insulating layer 102 may be formed of a piezoelectric material.

Figure 11:
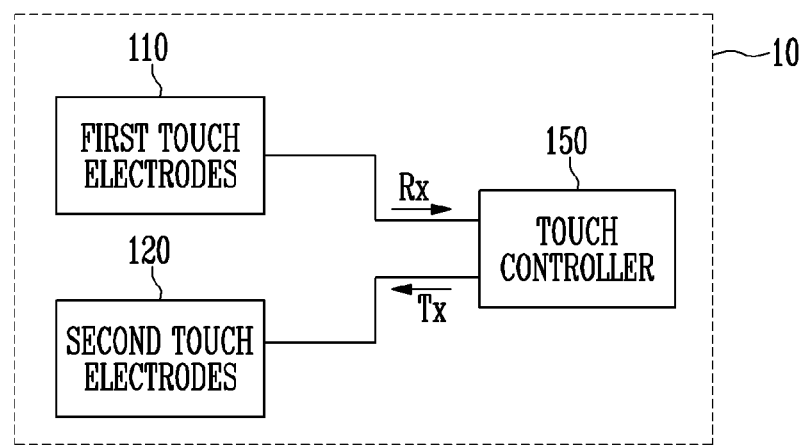
FIG. 11 is a simplified block diagram of a touch sensor in accordance with an embodiment of the present disclosure.
Figure 12:
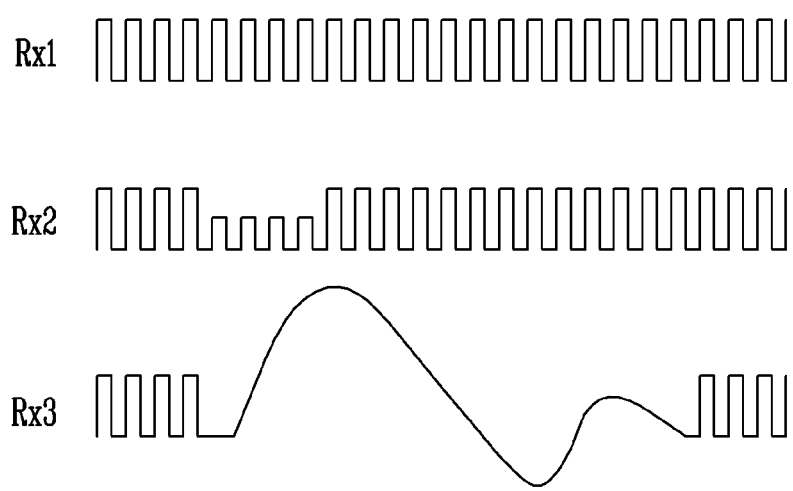
FIG. 12 is a diagram illustrating example waveforms of output signals outputted from first touch electrodes.

FIG. 11 is a simplified block diagram of a touch sensor 10 in accordance with an embodiment of the present disclosure. FIG. 12 is a diagram illustrating example waveforms of output signals outputted from the first touch electrodes 110.

Particularly, FIG. 12 illustrates a waveform of an output signal Rx1 generated when there is no touch applied to the touch sensor 10, a waveform of an output signal Rx2 generated when a touch is applied to the touch sensor 10 by a simple contact, and a waveform of an output signal Rx3 generated when a touch having a predetermined magnitude or larger is applied to the touch sensor 10.

Referring to FIG. 11, the touch sensor 10 may include a touch controller 150.

The touch controller 150 may detect a location and a magnitude of a touch using the first touch electrodes 110 and the second touch electrodes 120.

The touch controller 150 may supply driving signals Tx to the second touch electrodes 120 to drive the touch sensor 10. For example, the touch controller 150 may sequentially supply the driving signals Tx to the second touch electrodes 120, or simultaneously supply the driving signals Tx to at least two or more second touch electrodes 120.

The driving signals Tx may be transmitted to the second touch electrodes 120 through the second lines 132.

The touch controller 150 may detect the location and the magnitude of touch using output signals Rx outputted from the first touch electrodes 110.

Referring to FIG. 12, the output signal Rx1 generated when there is no touch applied to the touch sensor 10 may have a form of a clock signal that periodically oscillates between a high level and a low level If a touch is inputted to the touch sensor 10, capacitance between the first touch electrodes 110 and the second touch electrodes 120 that corresponds to the location of the touch may be changed, thereby changing the output signals Rx received by the touch controller 150.

Referring to FIG. 12, the amplitude of the output signal Rx2 may be changed by the changed capacitance during a period in which the touch is inputted.

If a touch having a predetermined magnitude or larger is inputted to the touch sensor 10, the voltages of the output signals Rx may be changed by a piezoelectric signal generated by the pressure of the touch. The piezoelectric signal may be generated by rearrangement of the dipoles between the first touch sensing cells 111 and the second touch sensing cells 121, or by a change in the direction of the dipole moments.

Referring to FIG. 12, the amplitude of the output signal Rx3 may be changed by the piezoelectric signal during a period in which the touch is inputted. For example, in the case where the amplitude of the output signal Rx1 generated when there is no touch applied to the touch sensor 10 is 3 mV, the amplitude of the output signal Rx3 changed by the piezoelectric signal may be approximately 1 V.

Referring to FIG. 12, the output signal Rx2 generated when touch is applied to the touch sensor 10 by a simple touch differs from the output signal Rx3 generated when a touch having a predetermined magnitude or larger is applied to the touch sensor 10. Furthermore, a variation of the output signal Rx2 generated when the simple touch is applied to the touch sensor 10 is different from a variation of the output signal Rx3 generated when the touch having a predetermined magnitude or larger is applied to the touch sensor 10. In other words, the variations of the output signal Rx pertaining to a variation in the capacitance and a piezoelectric signal may be characteristically different from each other. For example, the amplitude of the output signal Rx2 is reduced due to a change in the capacitance whereas the amplitude of the output signal Rx3 is increased by a piezoelectric signal.

As the magnitude of a touch increases, the amplitude of the output signal Rx3 changed by a piezoelectric signal may increase. The touch controller 150 may calculate the magnitude of the touch with reference to a variation of the output signal Rx3.

The touch controller 150 may detect information about changes in the voltage of the output signals and recognize the location and the magnitude of the touch using the detected information.

Although not explicitly shown, in the touch controller 150 may include separate processors including a processor configured to process an output signal reflecting information about a variation in the capacitance and a processor configured to process an output signal reflecting information about a piezoelectric signal.

Alternatively, the touch controller 150 may operate in a time-sharing manner. For example, the touch controller 150 may process the output signal reflecting the information about a variation in the capacitance during a first period, and process the output signal reflecting the information about a piezoelectric signal during a second period. The first period and the second period may be alternately repeated.

In accordance with an embodiment of the present disclosure, the location and the magnitude of touch may be complexly determined by a variation in the capacitance and a piezoelectric signal resulting from the touch.

In particular, because at least one of the insulating layers that are used to insulate touch electrodes is formed of a piezoelectric material, the touch sensor 10 may have a thin structure. Therefore, the touch sensor 10 may have bending or foldable characteristics.

Furthermore, the touch sensor 10 may integrate a capacitive touch sensor and a piezoelectric pressure sensor without requiring a change of an electrode structure or including a separate pressure sensor. Therefore, the production cost of the touch sensor 10 may be reduced.

Figure 13:
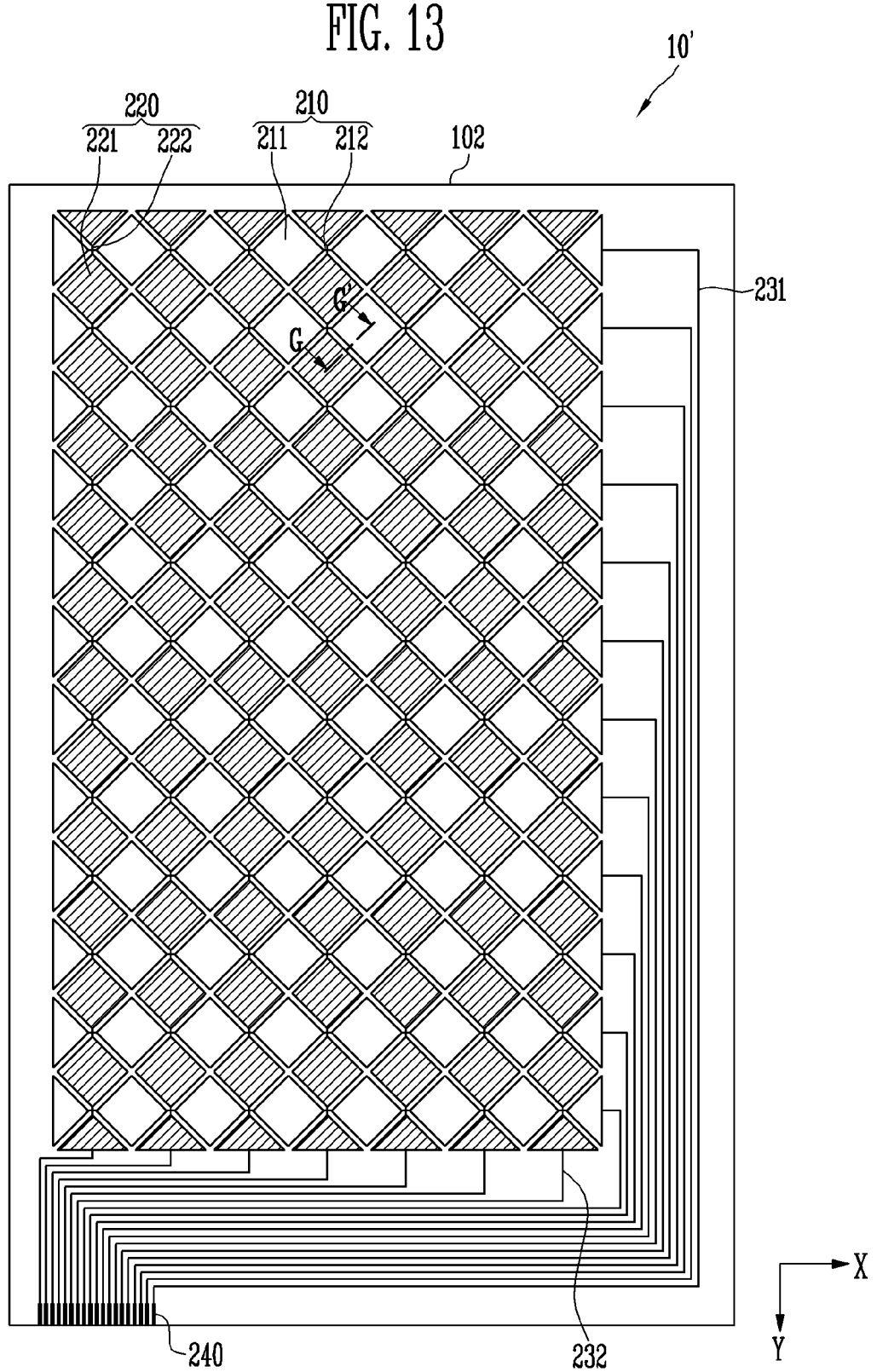
FIGS. 13 and 14 are diagrams illustrating the configuration of a touch sensor in accordance with an embodiment of the present disclosure.
Figure 14:
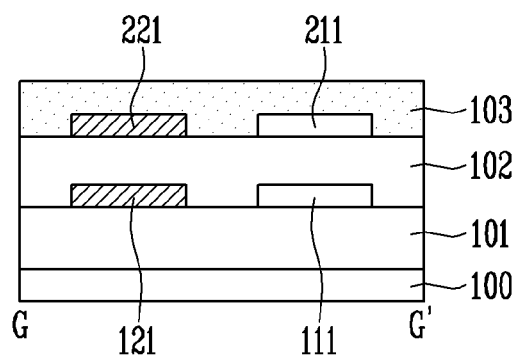

FIGS. 13 and 14 are diagrams illustrating the configuration of a touch sensor 10' in accordance with an embodiment of the present disclosure. Particularly, FIG. 14 is a cross-sectional view taken along line G-G' of FIG. 13.

In FIGS. 13 and 14, like reference numerals are used to designate the same parts as those described with reference to FIGS. 1 to 8. Detailed description of the same components as those of FIGS. 1 to 8 may be omitted, and differences from the embodiments of FIGS. 1 to 8 will be emphasized.

Referring to FIGS. 13 and 14, the touch sensor 10' may include a separate pressure sensor in addition to the above-described components such as the first touch electrodes 110, the first lines 131, the second touch electrodes 120, the second lines 132, the first insulating layer 101, and the second insulating layer 102.

The pressure senor may include a plurality of third touch electrodes 210 and a plurality of fourth touch electrodes 220.

The third touch electrodes 210 and the fourth touch electrodes 220 may be disposed on the second substrate 102.

The third touch electrodes 210 may extend in a first direction (e.g., an X-axis direction) and be arranged in a second direction (e.g., a Y-axis direction) intersecting the first direction.

The fourth touch electrodes 220 may extend in the second direction (e.g., the Y-axis direction) and be arranged in the first direction (e.g., the X-axis direction).

Each of the third touch electrodes 210 may include a third touch sensing cell 211. A plurality of third touch sensing cells may be arranged in the first direction (e.g., the X-axis direction) at predetermined intervals, and a plurality of third coupling patterns 212 may be configured to electrically couple adjacent third touch sensing cells 211 with one another.

Each of the fourth touch electrodes 220 may include a fourth touch sensing cell 221. A plurality of fourth touch sensing cells 221 may be arranged in the second direction (e.g., the Y-axis direction) at predetermined intervals, and a plurality of fourth coupling patterns 222 may be configured to electrically couple adjacent fourth touch sensing cells 221 with one another.

Here, the third touch sensing cells 211 may be distributed and disposed between adjacent fourth touch sensing cells 221, and the fourth touch sensing cells 221 may be distributed and disposed between adjacent third touch sensing cells 211. The third and fourth touch sensing cells 211 and 221 may not overlap with one another.

Although not shown, an insulating member may be disposed between the third coupling patterns 212 and the fourth coupling patterns 222 at intersections of the third and fourth coupling patterns 212 and 222 to electrically separate the third and fourth coupling patterns 212 and 222.

Referring to FIG. 13, the third touch sensing cells 211 and the fourth touch sensing cells 221 are illustrated as having the same shapes as those of the first touch sensing cells 111 and the second touch sensing cells 121. However, the present disclosure is not limited thereto. The shapes of the third and fourth touch sensing cells 211 and 221 may be changed in various ways.

The touch sensor 10' may further include a plurality of pads 240, a plurality of third lines 231, and a plurality of fourth lines 232. The third lines 231 may be coupled between the third touch electrodes 210 and the pads 240. The fourth lines 232 may be coupled between the fourth touch electrodes 220 and the pads 240.

The third and fourth lines 231 and 232 may be coupled to the external touch controller 150 shown in FIG. 11 by the pads 240.

Although in FIG. 13 the third and fourth lines 231 and 232 are illustrated as being coupled to the pads 240, the third and fourth lines 231 and 232 may be coupled to the pads 140 through contact holes (not shown) formed in the second insulating layer 102.

The touch controller 150 may provide driving signals to one of the third touch electrodes 210 or the fourth touch electrodes 220 and detect a location and a magnitude of a touch using signals outputted from the other of the third touch electrodes 210 or the fourth touch electrodes 220.

The third touch electrodes 210 and the fourth touch electrodes 220 may include a conductive material selected from among the above-described materials that the first and second touch electrodes 110 and 120 are made of.

Each of the third and fourth touch electrodes 210 and 220 may have a single layer or multilayer structure.

The third touch electrodes 210 and the fourth touch electrodes 220 may be made of the same material or different materials.

Referring to FIG. 14, the third insulating layer 103 may be disposed on the third touch electrodes 210, the fourth touch electrodes 220, and the second insulating layer 102

The third insulating layer 103 may be an inorganic insulating layer formed of an inorganic material, or an organic insulating layer formed of an organic material. In particular, the third insulating layer 103 may be formed of a piezoelectric material having piezoelectric characteristics.

Examples of the inorganic piezoelectric material include, but are not limited to, ZnO, BaTiO3, and PZT. Examples of the organic piezoelectric material include, but are not limited to, PVDF, P(VDF-TrFE), P(VDF-TrFE-CTFE), P(VDF-TrFE-CFE), and P(VDF-HFP).

In the present embodiment, the third insulating layer 103 including the piezoelectric material may correspond to a piezoelectric layer.

The third touch electrodes 210, the fourth touch electrodes 220, and the third insulating layer 103 may form a piezoelectric pressure sensor.

When an external force is applied to the third insulating layer 103, dipoles between the third touch cells 211 and the fourth touch cells 221 that are adjacent to each other may be rearranged, or the direction of dipole moments may be changed, whereby a piezoelectric signal may be generated. At least one of the third and fourth touch electrodes 210 and 220 may output an output signal corresponding to the generated piezoelectric signal.

The first insulating layer 101 and the second insulating layer 102 may have a single layer or multilayer structure including an inorganic material such as silicon oxide, silicon nitride, and silicon oxynitride.

Alternatively, the first and second insulating layers 101 and 102 may be formed of an organic insulating layer made of an organic material. Examples of the organic insulating material include, but are not limited to, a polyacryl-based compound, a polyimide-based compound, a fluorocarbon compound such as Teflon, or a benzocyclobutene compound.

The piezoelectric material may be included in only the third insulating layer 103 without being included in the first insulating layer 101 or the second insulating layer 102.

Figure 15:
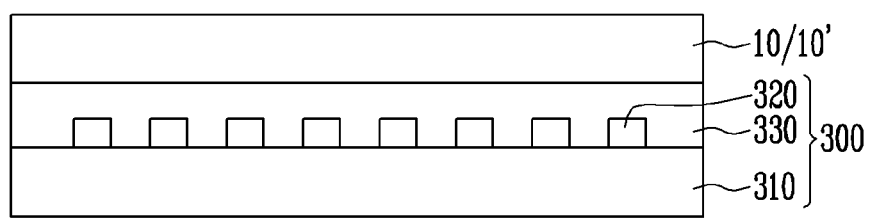
FIG. 15 is a diagram illustrating a display device in accordance with an embodiment of the present disclosure.

FIG. 15 is a diagram illustrating a display device in accordance with an embodiment of the present disclosure.

Referring to FIG. 15, the touch sensor 10 (or 10') in accordance with an embodiment of the present disclosure may be disposed on a display panel 300.

The touch sensor 10 (or 10') is disposed on the display panel 300 can detect a touch inputted to the display panel 300.

The display panel 300 may include a substrate 310, a plurality of pixels 320, and an encapsulation layer 330.

The pixels 320 may be disposed on the substrate 310. The encapsulation layer 330 may be disposed on the pixels 320 and the substrate 310.

For example, the substrate 310 may be made of an insulating material such as glass or resin. Furthermore, the substrate 310 may be made of a material having flexibility to be bendable or foldable. The substrate 310 may have a single layer or multilayer structure.

For example, the substrate 310 may include a material selected from among materials that the above-mentioned substrate 100 can be made of The pixels 320 may emit light based on a control signal received from a display driver (not shown). The encapsulation layer 330 may protect the pixels 320 and planarize the surface of the display panel 300.

The display driver may generate control signals in response to an external input signal (e.g., a vertical synchronization signal and a horizontal synchronization signal), and supply the generated control signals to the corresponding pixels 320 of the display panel 300 to control an image display operation of the display panel 300.

For instance, the encapsulation layer 330 may prevent water, oxygen, etc. from penetrating into the pixels 320.

The encapsulation layer 330 may include at least one of glass, an organic material, and an inorganic material. The encapsulation layer 330 may have a single layer or multilayer structure.

For example, the encapsulation layer 330 may have a multilayer structure including at least one organic layer and at least one inorganic layer.

In an embodiment, examples of the organic insulating material include, but are not limited to, polyacryl, polyimide, a fluorocarbon compound such as Teflon, polyepoxy, and benzocyclobutene. Examples of the inorganic insulating material include, but are not limited to, polysiloxane, silicon nitride, silicon oxide, metal oxide including aluminum oxide.

In an embodiment, the touch sensor 10 (or 10') may be disposed on the encapsulation layer 330 of the display panel 300.

For example, the touch sensor 10 (or 10') may be disposed on a separate substrate (not shown) that is disposed on the encapsulation layer 330, or directly disposed on the encapsulation layer 330.

Figure 16:
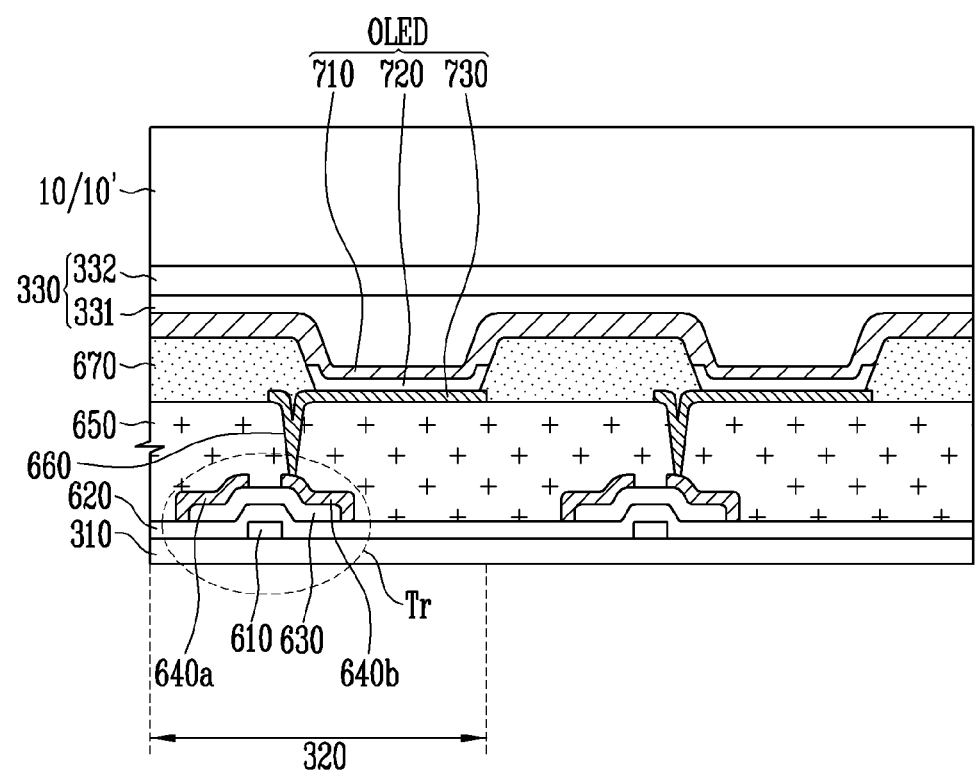
FIG. 16 is a cross-sectional view illustrating a portion of the display device of FIG. 15.

FIG. 16 is a cross-sectional view illustrating a portion of the display device of FIG. 15.

Referring to FIG. 16, an organic light-emitting diode OLED may include an anode electrode 730, an emission layer 720, and a cathode electrode 710.

The emission layer 720 may be disposed between the anode electrode 730 and the cathode electrode 710.

For example, the emission layer 720 may include an organic emission layer for spontaneous emission.

The emission layer 720 may have a structure in which a hole transporting layer, an organic emission layer, and an electron transporting layer are stacked. The emission layer 720 may further include a hole injection layer and an electron injection layer.

In the above-mentioned structure, holes injected from the anode electrode 730 and electrons injected from the cathode electrode 710 may be combined with each other in the organic emission layer, thus generating excitons. Light having a certain wavelength may be generated from each emission layer 720 based on an energy level from the generated excitons.

The cathode electrode 710 may include a conductive material. For example, the conductive material may include a metal, an alloy of metals, a conductive polymer, or a transparent conductive material.

For example, the cathode electrode 710 may include a material selected from among the above-described materials that the first touch electrodes 110 and the second touch electrodes 120 are made of.

A plurality of pixels 320 may be disposed on the substrate 310. Each pixel 320 may be formed of an organic light-emitting diode OLED, and a pixel circuit (not shown) including a driving transistor Tr configured to control a current flow to the organic light-emitting diode OLED.

In FIG. 16, only the driving transistor Tr is illustrated to be coupled to the organic light-emitting diode OLED. However, a pixel circuit (not shown) may further include a capacitor, other transistors, etc. in addition to the driving transistor Tr to control emission of the organic light-emitting diode OLED.

The driving transistors Tr may be disposed on the substrate 310, and each driving transistor Tr may correspond to the associated organic light-emitting diode OLED.

The driving transistor Tr may include a gate electrode 610, a gate insulating layer 620, a semiconductor layer 630, and source and drain electrodes 640a and 640b.

The gate electrode 610 may be disposed on the substrate 310.

The gate insulating layer 620 may be disposed on the gate electrode 610 and the substrate 310. For example, the gate insulating layer 620 may be formed of an insulating material such as silicon oxide (SiOx) and silicon nitride (SiNx).

The semiconductor layer 630 may be disposed on the gate insulating layer 620. For example, the semiconductor layer 630 may be made of a poly silicon by crystallizing an amorphous silicon using a laser or the like.

Furthermore, the semiconductor layer 630 may also be made of an amorphous silicon, an oxide semiconductor, etc. in addition to a poly silicon.

The source and drain electrodes 640a and 640b may be disposed on opposite sides of the semiconductor layer 630 in a cross-sectional view.

A protective layer 650 may be disposed on the driving transistor Tr and have a contact hole 660 through which the source electrode 640a or the drain electrode 640b is exposed. In FIG. 16, the drain electrode 640b is illustrated to be exposed through the contact hole 660.

The gate electrode 610 and the source and drain electrodes 640a and 640b may be made of a metal such as molybdenum (Mo), tungsten (W), titanium (Ti), or aluminum (Al), or an alloy of these metals. The gate electrode 610 may include a stacked structure. However, the present disclosure is not limited thereto.

The anode electrode 730 may be disposed on the protective layer 650. The anode electrode 730 may be coupled to the source electrode 640a or the drain electrode 640b through the contact hole 660. In FIG. 16, the anode electrode 730 is illustrated to be coupled to the drain electrode 640b through the contact hole 660.

For example, the protective layer 650 may be made of an insulating material such as silicon oxide and silicon nitride.

A pixel defining layer 670 may be disposed on the protective layer 650. Furthermore, the pixel defining layer 670 may expose at least a certain region of the anode electrode 730.

For example, the pixel defining layer 670 may be made of one of organic insulating materials including, but not limited to, an acryl-based organic compound, polyamide, and polyimide. Various insulating materials may be used as the material of the pixel defining layer 670.

The encapsulation layer 330 may be disposed on the organic light-emitting diode OLED. In particular, the encapsulation layer 330 may be disposed on the cathode electrode 710.

The encapsulation layer 330 may have a structure in which a plurality of layers are stacked. For example, the encapsulation layer 330 may include at least one organic layer 331 and at least one inorganic layer 332.

Referring to FIG. 16, the encapsulation layer 330 is illustrated to include a single organic layer 331 and a single inorganic layer 332. However, the encapsulation layer 330 may include a plurality of organic layers 331 and/or a plurality of inorganic layers 332. The organic layers 331 and the inorganic layers 332 may be alternately stacked.

The encapsulation layer 330 may function as the substrate 100 of the touch sensor 10 described with respect to FIGS. 1 to 9C. In other words, the substrate 100 may be omitted, and the first insulating layer 101 may be disposed on the encapsulation layer 330.

Although not shown in FIG. 15, if the encapsulation layer 330 functions as the substrate of the touch sensor 10, a buffer layer (not shown) may be further disposed between the encapsulation layer 330 and the first insulating layer 101. The buffer layer may be provided to minimize a damage to the encapsulation layer 330 and the organic light-emitting diodes OLED when elements of the touch sensor 10 are formed.

The buffer layer may include an inorganic insulating material and may include a single layer or multilayer structure.

As described above, various embodiments of the present disclosure are directed to a touch sensor capable of complexly determining a location and a magnitude of touch, and a display device including the touch sensor.

Various embodiments of the present disclosure are directed to a touch sensor having a thin structure and flexible characteristics, and a display device including the touch sensor.

Various embodiments of the present disclosure may reduce a manufacturing cost of the touch sensor and the display device including the touch sensor.

Example embodiments have been disclosed herein. Although specific terms are employed, they are used and are to be interpreted in a generic and descriptive sense only and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise explicitly indicated. Accordingly, it will be understood by those of skill in the art that various changes in form and details may be made without departing from the spirit and scope of the present disclosure as set forth in the following claims.

What is claimed is:

1. A touch sensor comprising:
a first insulating layer disposed on a substrate;
a plurality of first touch sensing cells disposed on the first insulating layer and coupled to each other in a first direction by first coupling patterns;
a plurality of second touch sensing cells disposed on the first insulating layer and coupled to each other in a second direction by second coupling patterns; and
a second insulating layer disposed on the first touch sensing cells and the second touch sensing cells,
wherein the plurality of first touch sensing cells and the plurality of second touch sensing cells are disposed on a same surface of the first insulating layer and in contact with the first insulating layer and the second insulating layer, and
wherein at least one of the first insulating layer or the second insulating layer includes a piezoelectric material.

2. The touch sensor according to claim 1, wherein the piezoelectric material includes at least one of ZnO, BaTiO3, PZT, PVDF, P(VDF-TrFE), P(VDF-TrFE-CTFE), P(VDF-TrFE-CFE), or P(VDF-HFP).

3. The touch sensor according to claim 1, wherein the second coupling patterns are disposed under the first insulating layer and coupled to the second touch sensing cells through contact holes formed in the first insulating layer.

4. The touch sensor according to claim 3,
wherein the second insulating layer includes the piezoelectric material,
wherein, when a touch having a predetermined magnitude or larger is applied to the touch sensor, a piezoelectric signal is generated by the second insulating layer corresponding to the touch.

5. The touch sensor according to claim 3,
wherein the first insulating layer includes the piezoelectric material,
wherein, when a touch having a predetermined magnitude or larger is applied to the touch sensor, a piezoelectric signal is generated by the first insulating layer corresponding to the touch.

6. The touch sensor according to claim 1,
wherein, when a touch is inputted to the touch sensor, capacitance between the first touch sensing cells and the second touch sensing cells that corresponds to the touch is changed.

7. The touch sensor according to claim 6, further comprising:
a touch controller configured to sense a location and a magnitude of a touch inputted to the touch sensor using output signals of the first touch sensing cells,
wherein each of the output signals includes at least one of a voltage variation corresponding to a variation in the capacitance or a voltage variation corresponding to a piezoelectric signal generated by the piezoelectric material.

8. The touch sensor according to claim 1, wherein the first touch sensing cells and the second touch sensing cells have a mesh structure.

9. A touch sensor comprising:
a plurality of first touch electrodes including first coupling patterns, and first touch sensing cells coupled to each other in a first direction by the first coupling patterns;
a plurality of second touch electrodes including second coupling patterns, and second touch sensing cells coupled to each other in a second direction by the second coupling patterns; and
a piezoelectric layer disposed on the first touch sensing cells and the second touch sensing cells,
wherein the second coupling patterns are disposed on the piezoelectric layer and coupled to the second touch sensing cells through contact holes formed in the piezoelectric layer, and
wherein the plurality of first touch electrodes and the plurality of second touch electrodes are disposed on a same surface of the piezoelectric layer and in contact with the piezoelectric layer.

10. The touch sensor according to claim 9, further comprising:
an insulating layer disposed on the second coupling patterns and the piezoelectric layer.

11. The touch sensor according to claim 9, wherein the piezoelectric layer includes at least one of ZnO, BaTiO3, PZT, PVDF, P(VDF-TrFE), P(VDF-TrFE-CTFE), P(VDF-TrFE-CFE), or P(VDF-HFP).

12. The touch sensor according to claim 9, wherein, when a touch having a predetermined magnitude or larger is applied to the touch sensor, a piezoelectric signal is generated by the piezoelectric layer corresponding to the touch.

13. The touch sensor according to claim 12, further comprising:
a touch controller configured to sense a location and a magnitude of a touch inputted to the touch sensor using output signals of the first touch sensing cells, wherein each of the output signals includes at least one of a voltage variation corresponding to a variation in capacitance between the first touch electrodes or the second touch electrodes and a voltage variation corresponding to the piezoelectric signal.

14. A touch sensor comprising:
first touch electrodes, and second touch electrodes configured to form capacitance with the first touch electrodes;
an insulating layer disposed on the first touch electrodes and the second touch electrodes;
third touch electrodes and fourth touch electrodes disposed on the insulating layer; and
a piezoelectric layer disposed on the third touch electrodes and the fourth touch electrodes,
wherein the piezoelectric layer generates a piezoelectric signal corresponding to an external force, and
wherein the first touch electrodes and the second touch electrodes are in contact with a first surface of the insulating layer, the third touch electrodes and the fourth touch electrodes are contact with a second surface of the insulating layer that is opposite to the first surface in a thickness direction, and the third touch electrodes and the fourth touch electrodes are in contact with a surface of the piezoelectric layer.

15. The touch sensor according to claim 14, wherein the piezoelectric layer includes at least one of ZnO, BaTiO3, PZT, PVDF, P(VDF-TrFE), P(VDF-TrFE-CTFE), P(VDF-TrFE-CFE), or P(VDF-HFP).

16. The touch sensor according to claim 14, further comprising:
a touch controller configured to calculate a location or a magnitude of a touch with reference to at least one of a variation in capacitance included in an output signal of the first touch sensing electrodes or a piezoelectric signal included in an output signal of the third touch sensing electrodes.

17. A display device comprising:
a plurality of light-emitting elements;
an encapsulation layer disposed on the light-emitting elements;
a first insulating layer disposed on the encapsulation layer;
a plurality of first touch sensing cells disposed on the first insulating layer and coupled to each other in a first direction by first coupling patterns;
a plurality of second touch sensing cells disposed on the first insulating layer and coupled to each other in a second direction by second coupling patterns; and
a second insulating layer disposed on the first touch sensing cells and the second touch sensing cells,
wherein the plurality of first touch sensing cells and the plurality of second touch sensing cells are disposed on a same surface of the first insulating layer and in contact with the first insulating layer and the second insulating layer, and
wherein at least one of the first insulating layer or the second insulating layer includes a piezoelectric material.

18. The display device according to claim 17, wherein, when a touch having a predetermined magnitude or larger is applied to the display device, a piezoelectric signal is generated by the piezoelectric material corresponding to the touch.

* * * * *